US008942933B2

(12) United States Patent
Murata

(10) Patent No.: US 8,942,933 B2
(45) Date of Patent: Jan. 27, 2015

(54) POWER CONSUMPTION CALCULATION APPARATUS, POWER CONSUMPTION CALCULATION METHOD, AND STATE TRANSITION DATA GENERATION METHOD

(75) Inventor: Jun Murata, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 677 days.

(21) Appl. No.: 12/559,952

(22) Filed: Sep. 15, 2009

(65) Prior Publication Data

US 2010/0070216 A1    Mar. 18, 2010

(30) Foreign Application Priority Data

Sep. 17, 2008  (JP) ................................. 2008-238619
Sep. 17, 2008  (JP) ................................. 2008-238620

(51) Int. Cl.
*G01R 21/00* (2006.01)
*G01R 22/10* (2006.01)
*G03G 15/00* (2006.01)
(Continued)

(52) U.S. Cl.
CPC ............ *G01R 22/10* (2013.01); *G03G 15/5004* (2013.01); *G03G 15/55* (2013.01); *G06F 1/3203* (2013.01); *G06F 1/3284* (2013.01); *H04N 1/00002* (2013.01); *H04N 1/00015* (2013.01); *H04N 1/00034* (2013.01); *H04N 1/0005* (2013.01); *H04N 1/00055* (2013.01); *H04N 1/00061* (2013.01); *H04N 1/00068* (2013.01); *H04N 1/00127* (2013.01); *H04N 2201/0039* (2013.01); *H04N 2201/0082* (2013.01);

(Continued)

(58) Field of Classification Search
CPC ...................................................... G01R 21/133
USPC ............................................................ 702/61
See application file for complete search history.

(56) References Cited

U.S. PATENT DOCUMENTS 6,795,829 B2 * 9/2004 Alsop et al. ........................... 1/1
7,103,787 B2 * 9/2006 Cantwell ....................... 713/320
(Continued)

FOREIGN PATENT DOCUMENTS

JP      2002-6696        1/2002
JP      2002-297715     10/2002
(Continued)

OTHER PUBLICATIONS

Japanese Office Action issued Jul. 8, 2014, in Japan Patent Application No. 2013-216913.

*Primary Examiner* — Patrick Assouad
*Assistant Examiner* — Haidong Zhang
(74) *Attorney, Agent, or Firm* — Oblon, Spivak, McClelland, Maier & Neustadt, L.L.P.

(57) ABSTRACT

A power consumption calculation apparatus is disclosed, including: a work load measurement part, a management part, and a power consumption calculation part. The work load measurement part measures a work load of a job executed by an image forming apparatus and records a measured value, at predetermined time intervals. The management part manages state transition data indicating power consumption and a required time for each of states of the image forming apparatus which transits in response to an execution of each job. The power consumption calculation part calculates a power consumption amount corresponding to one job execution at each predetermined time interval when it is determined that the job is executed, based on the measured value and the state transition data.

13 Claims, 12 Drawing Sheets

(51) Int. Cl.
　　*G06F 1/32*　　　(2006.01)
　　*H04N 1/00*　　　(2006.01)
(52) U.S. Cl.
　　CPC　*H04N2201/0091* (2013.01); *H04N 2201/0094* (2013.01); *Y02B 60/1267* (2013.01)
　　USPC .......................... 702/61; 358/1.13; 358/1.14

(56) References Cited

U.S. PATENT DOCUMENTS

| | | | |
|---|---|---|---|
| 7,120,372 B2 * | 10/2006 | Kim et al. | 399/70 |
| 7,517,162 B2 * | 4/2009 | Aizawa | 400/62 |
| 2002/0140964 A1 * | 10/2002 | Goto et al. | 358/1.14 |
| 2004/0246512 A1 * | 12/2004 | Miyamoto | 358/1.13 |
| 2007/0280708 A1 * | 12/2007 | Kamisuwa et al. | 399/37 |

FOREIGN PATENT DOCUMENTS

| | | |
|---|---|---|
| JP | 2003-131763 | 5/2003 |
| JP | 2003-309684 | 10/2003 |
| JP | 2003-337750 | 11/2003 |
| JP | 2006-39443 | 2/2006 |
| JP | 3784151 | 3/2006 |
| JP | 2006-146360 | 6/2006 |
| JP | 2006-317355 | 11/2006 |
| JP | 2007-41865 | 2/2007 |
| JP | 2007-48219 | 2/2007 |
| JP | 2008-15748 | 1/2008 |

* cited by examiner

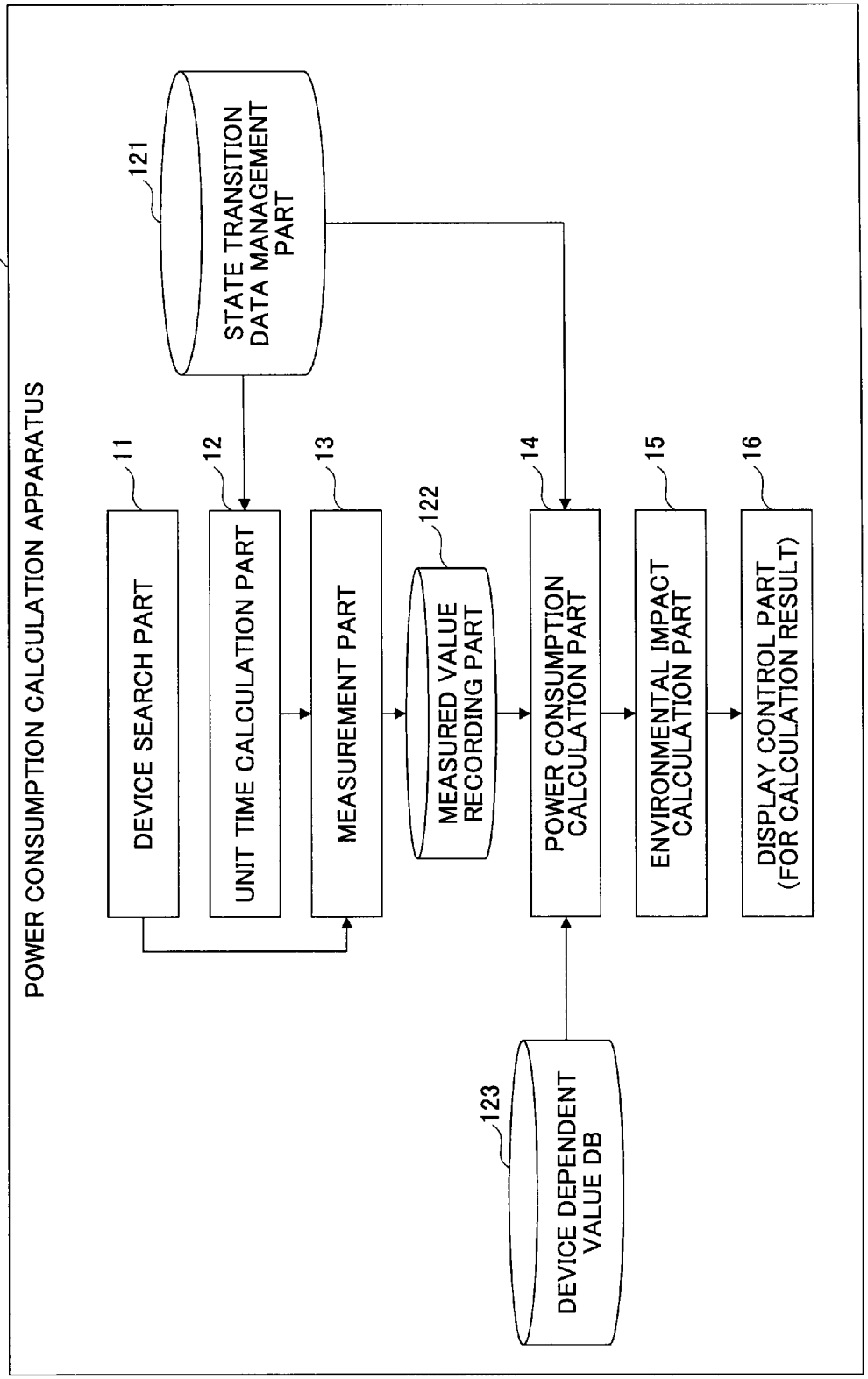

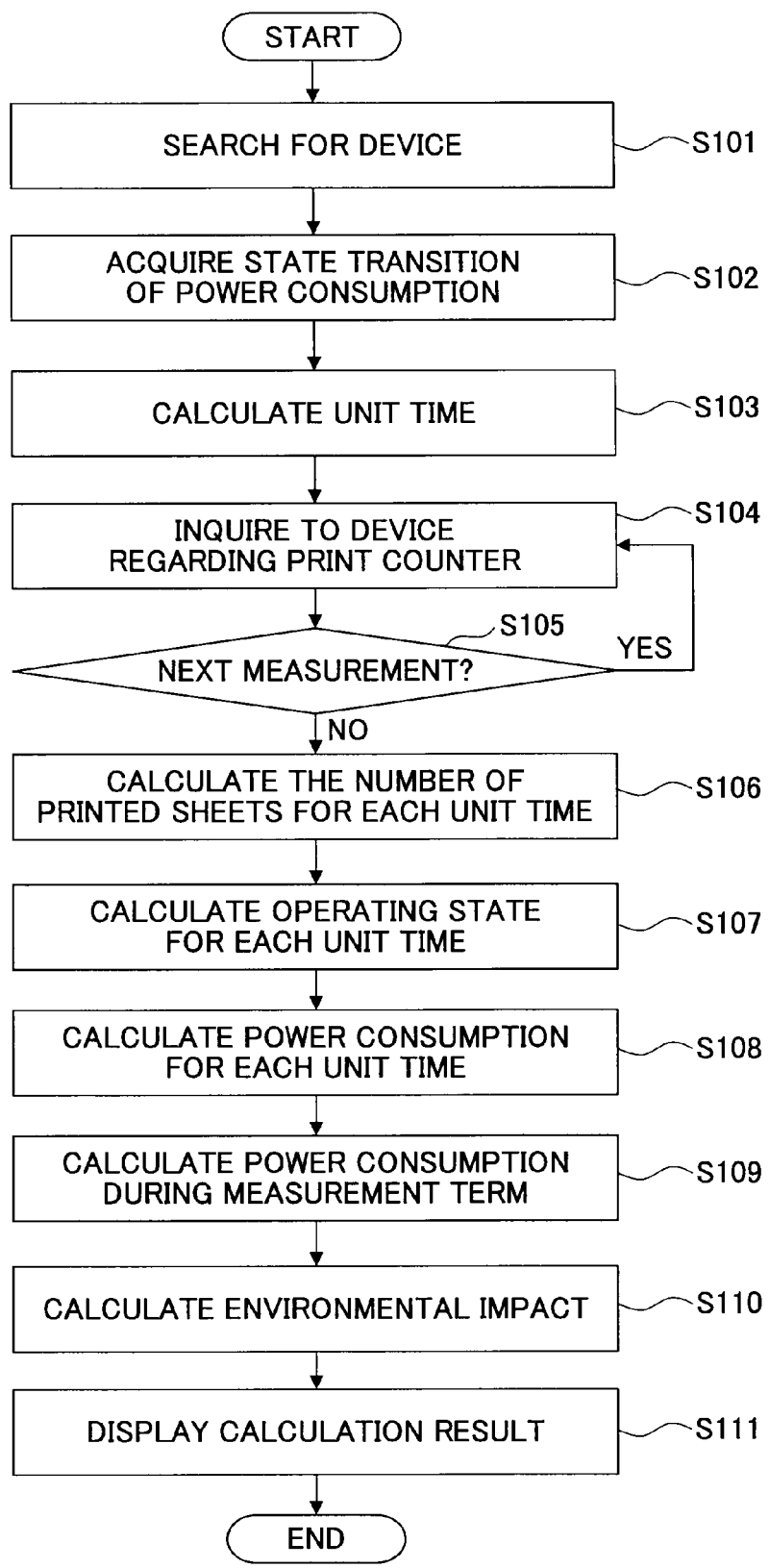

```
<?xml version="1.0" encoding="utf-8"?>
<deviceprofile model="AAA">
  <states>
    <state name="PRE-PROCESS">
      <time type="second">43</time>
      <power>1500</power>
    </state>
    <state name="OPERATING">
      <time>[RelationPrintTime]</time>
      <power>1050</power>
    </state>
    <state name="WAITING">
      <time type="second">300</time>
      <power>700</power>
    </state>
    <state name="SLEEP">
      <time type="second">900</time>
      <power>100</power>
    </state>
    <state name="OFF">
      <power>10</power>
    </state>
  </states>
</deviceprofile>
```

FIG.6

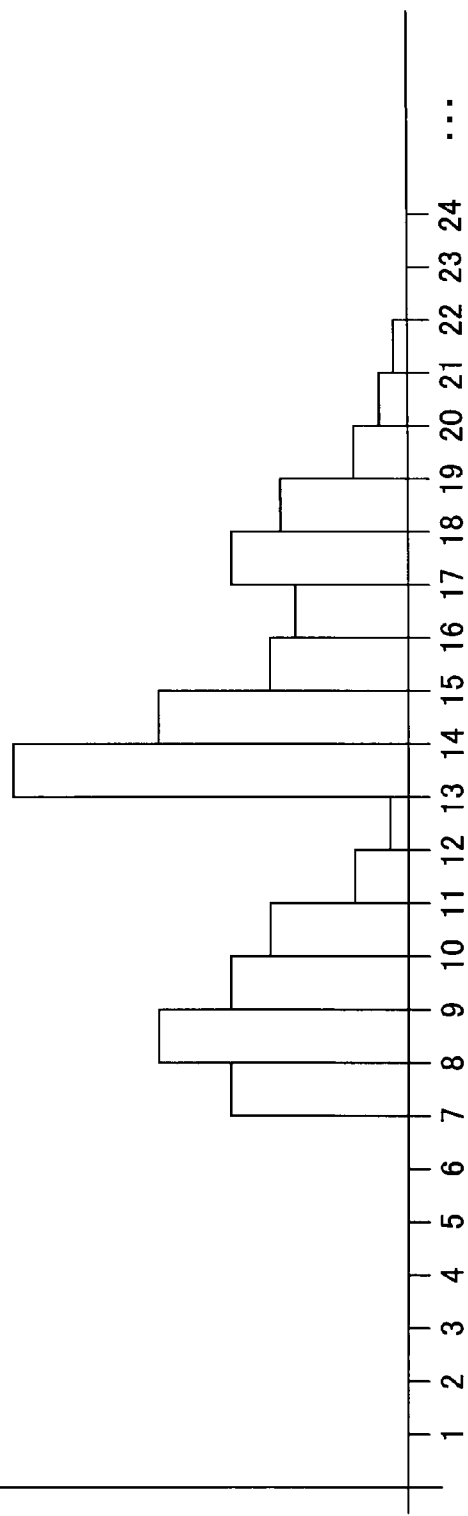

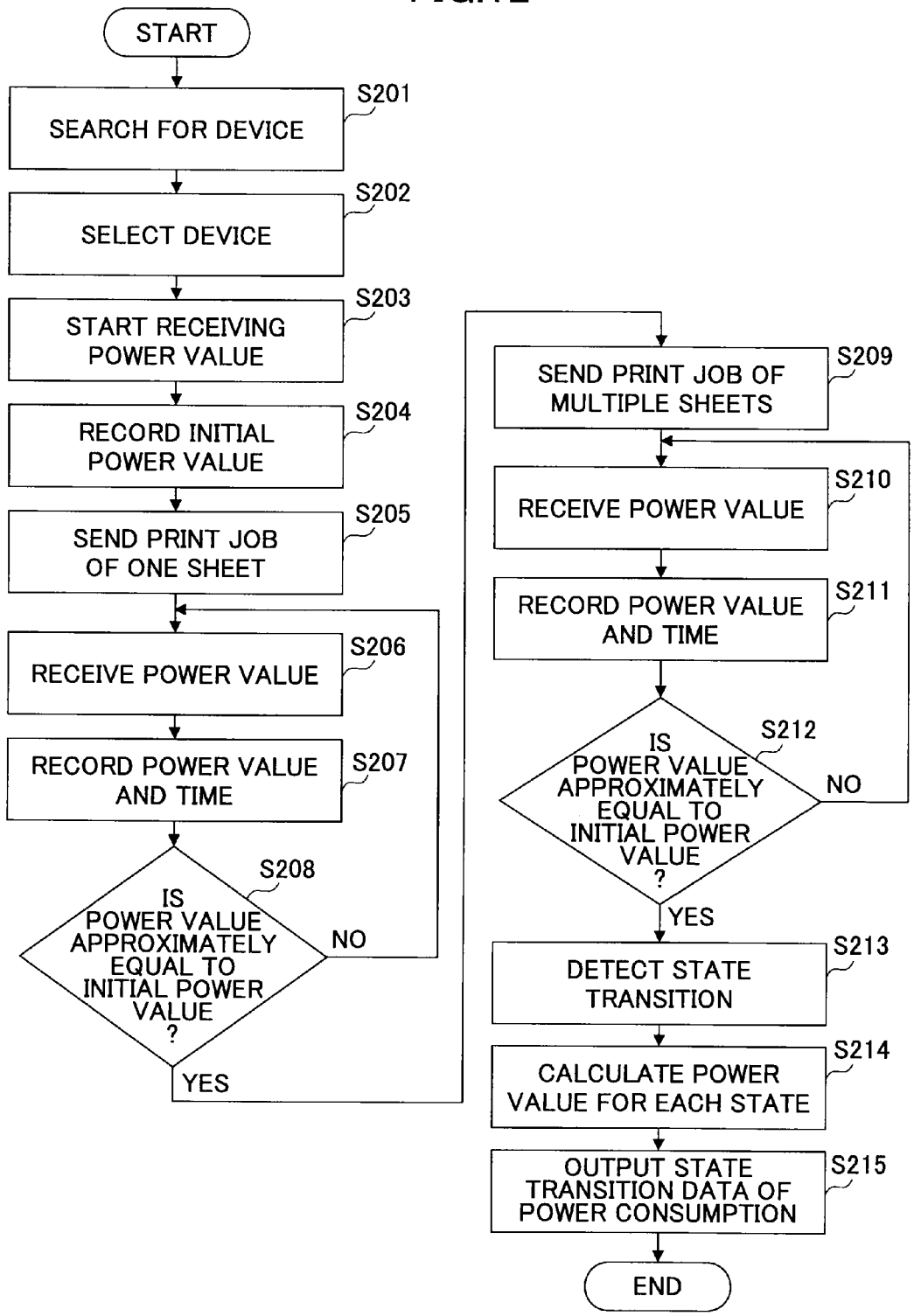

POWER CONSUMPTION CALCULATION APPARATUS, POWER CONSUMPTION CALCULATION METHOD, AND STATE TRANSITION DATA GENERATION METHOD

BACKGROUND OF THE INVENTION

1. Field of the Invention

The present invention is related to a power consumption calculation apparatus, a power consumption calculation method, and a state transition data generation method, and in particular to, the power consumption calculation apparatus, the power consumption calculation method, and the state transition data generation method, which calculate power consumption of an image forming apparatus.

2. Description of the Related Art

Recently, manufacturers and consumers have become more environmentally oriented and concerned more about energy savings, and awareness of the environment or the energy savings has been improved regarding an image forming apparatus (hereinafter, called "device") such as a printer, a copier, or a multi-functional apparatus. For example, a device of lower power consumption is preferable on the market. Information concerning the power consumption of devices of major manufacturers is openly published, and is used as important information by consumers to choose a device to purchase. In addition, even after purchasing a device, a user of the device tends to be concerned about the power consumption of the purchased device at his/her office.

Conventionally, in order to comprehend the power consumption in an actual operation environment of the device, it is required to actually connect a power meter to the device to measure, except for a tenant building which centrally manages power of the entire office.

However, at offices installing a plurality of devices, it is impractical to connect a power meter to each of the devices, and it is not practical due to expense.

SUMMARY OF THE INVENTION

The present invention solves or reduces one or more of the above problems.

In an aspect of this disclosure, there is provided a power consumption calculation apparatus, including: a work load measurement part configured to measure a work load of a job executed by an image forming apparatus and to record a measured value, at predetermined time intervals; a management part configured to manage state transition data indicating power consumption and a required time for each of states of the image forming apparatus which transits in response to an execution of each job; and a power consumption calculation part configured to calculate a power consumption amount corresponding to one job execution at each predetermined time interval when it is determined that the job is executed, based on the measured value and the state transition data.

In the power consumption calculation apparatus, it is possible to properly calculate the power consumption amount of the image forming apparatus.

In other aspects of this disclosure, there may be provided a power consumption calculation method performed by a computer including a processor, and a state transition data generation method performed by a computer including a processor.

BRIEF DESCRIPTION OF THE DRAWINGS

In the following, embodiments of the present invention will be described with reference to the accompanying drawings.

FIG. 4 is a diagram illustrating a functional configuration example of the power consumption calculation apparatus according to the first embodiment of the present invention;

FIG. 5 is a flowchart for explaining steps of a process conducted by the power consumption calculation apparatus;

FIG. 6 is a diagram illustrating a detailed example of power consumption state transition data;

FIG. 7 is a diagram illustrating an example of measured value data;

FIG. 12 is a flowchart for explaining steps of a process conducted by the state transition data generation apparatus for the power consumption.

DESCRIPTION OF THE PREFERRED EMBODIMENT

Figure 1:
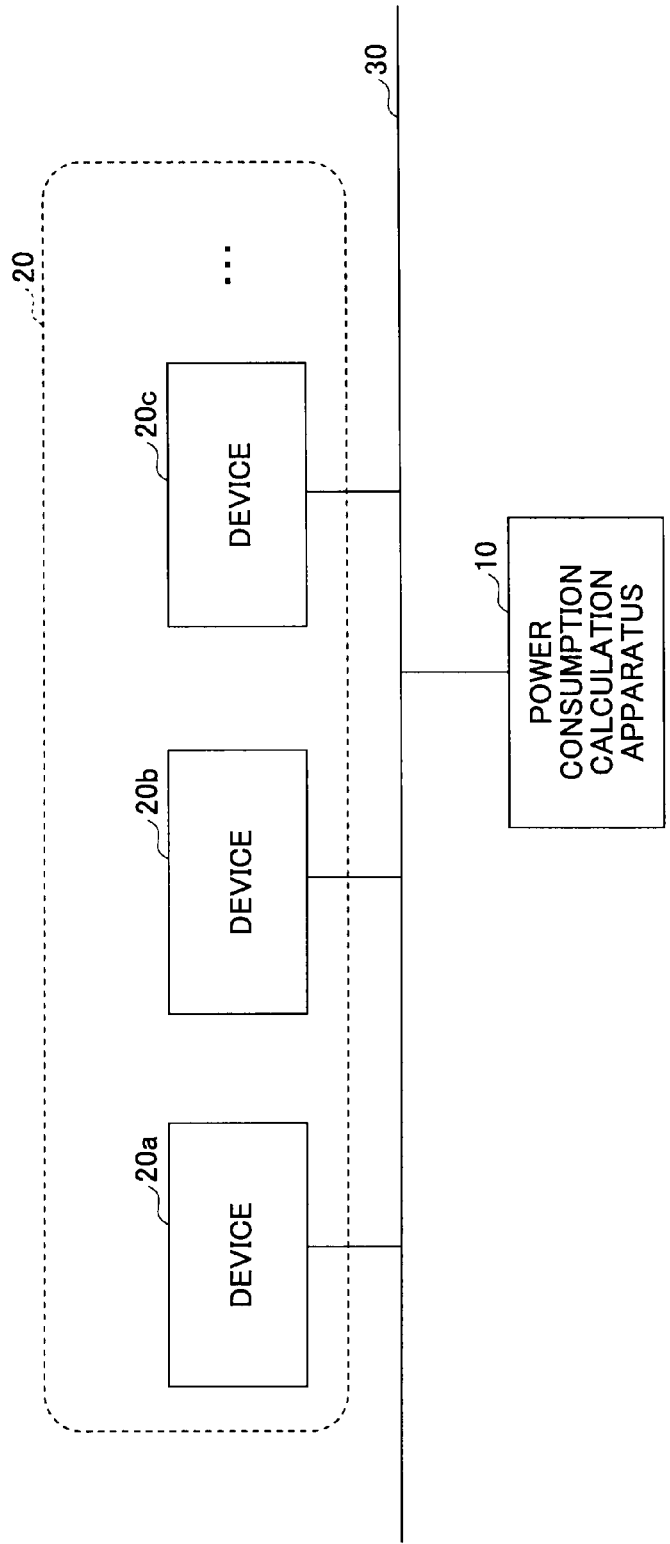
FIG. 1 is a diagram illustrating a configuration example of a power consumption calculation system according to a first embodiment of the present invention.

In the following, the present invention will be described with reference to the accompanying drawings. FIG. 1 is a diagram illustrating a configuration example of a power consumption calculation system according to a first embodiment of the present invention. In FIG. 1, a power consumption calculation apparatus 10 is connected to one or more devices 20 (devices 20a, 20b, 20c, and the like) through a network 30 (wired or wireless) such as a LAN (Local Area Network).

The device 20 is an image forming apparatus such as a printer, a copier, a scanner, a facsimile, or a multi-functional apparatus which realizes two or more these functions in a single body. The power consumption calculation apparatus 10 is a computer which calculates (estimates) power consumption of each device 20.

Figure 2:
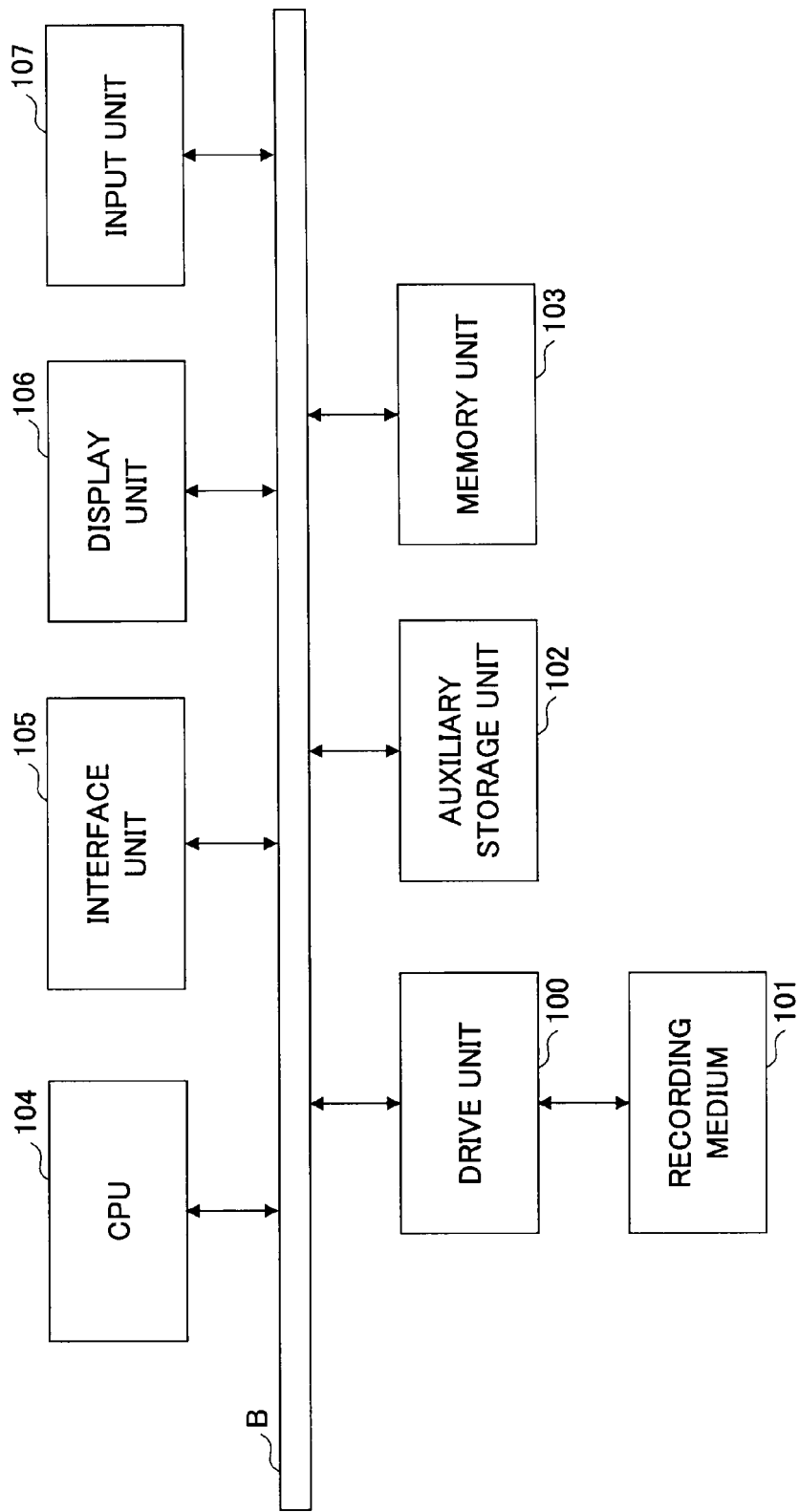
FIG. 2 is a diagram illustrating a hardware configuration example of a power consumption calculation apparatus according to the first embodiment of the present invention.

FIG. 2 is a diagram illustrating a configuration example of hardware of the power consumption calculation apparatus according to the first embodiment of the present invention. The power consumption calculation apparatus 10 in FIG. 2 includes a drive unit 100, an auxiliary storage unit 102, a memory unit 103, a CPU (Central Processing Unit) 104, an interface unit 105, a display unit 106, and an input unit 107, which are mutually connected via a bus B.

A program for realizing processes conducted in the power consumption calculation apparatus 10 is provided by a recording medium 101 such as a CD-ROM (Compact Disk Read Only Memory) or the like. When the recording medium 101 recording the program is set into the drive unit 100, the program is installed from the recording medium 101 to the auxiliary storage unit 102 via the drive unit 100. It is not required to always install the program from the recording medium 101. The program may be downloaded from another computer through a network. The auxiliary storage unit 102 stores the installed program and also stores necessary files, data, and the like.

The memory unit 103 reads out and stores the program from the auxiliary storage unit 102 when receiving an activation instruction of the program. The CPU 104 realizes functions of the power consumption calculation apparatus 10 in accordance with the program stored in the memory unit 103. The interface unit 105 is used as an interface to connect to the network 30. The display unit 106 displays a GUI (Graphical User Interface) or the like created by the program. The input unit 107 includes a keyboard, a mouse, and the like and is used to input various operation instructions.

In the above-described system configuration, the power consumption calculation apparatus 10 calculates power consumption of the devices 20 by considering a relation between a state transition of the devices 20 and the power consumption (amount) when a job is entered. A state of each device 20 is an execution state of the job in the device 20.

Figure 3:
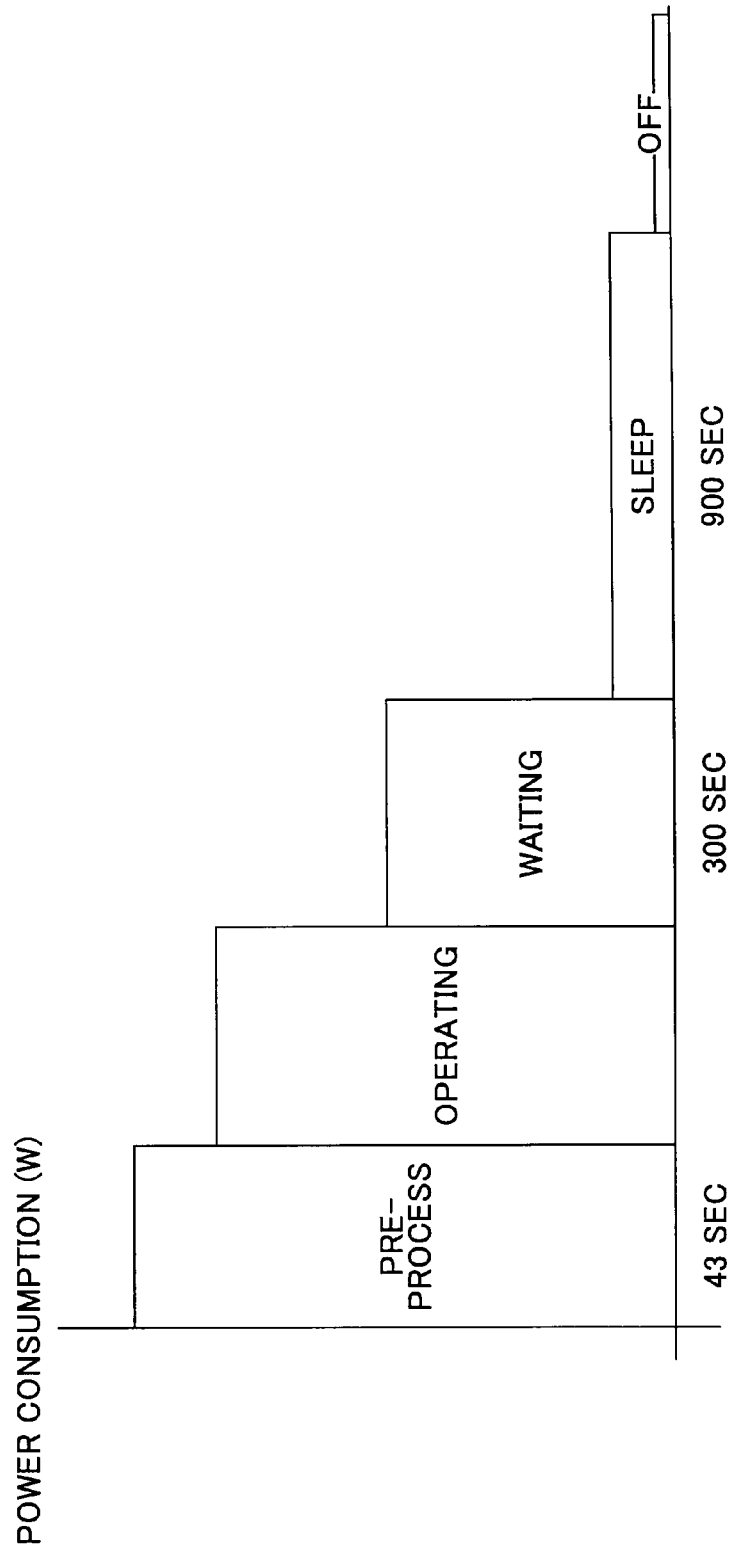
FIG. 3 is a diagram illustrating a relation between a state transition and power consumption of a device when a job is entered.

FIG. 3 is a diagram illustrating the relation between the state transition and the power consumption of the device according to the first embodiment. In FIG. 3, a horizontal axis indicates a time (second) and a vertical axis indicates the power consumption (W).

In FIG. 3, the operating state is a state in which a job is actually executed. A required time of the operating state changes depending on a work load or an execution amount (the number of print sheets in this embodiment) of the job. On the other hand, the required time for each of the pre-process state, the waiting state, and the sleep state is constant without being influenced by the work load of the job. In FIG. 3, the pre-process state requires 43 seconds, the waiting state requires 300 seconds, and the sleep state requires 900 seconds. The OFF state is a steady state (a state in which a job does not begin). When a job is entered in the OFF state, a state transits to the pre-process state. Accordingly, the required time of the OFF state in a predetermined term is acquired by deducting an aggregated required time for the pre-process state, the operating state, the waiting state, and the sleep state from the predetermined term.

The power consumption and the required time for each state transition and for each state are known with respect to each device type or each platform. Accordingly, for example, if it is possible to know the number of the state transitions and the work load of the job in each state transition in one day, the power consumption of the devices 20 can be calculated for that day. In detail, for example, if a print job is entered during a day, the state transition illustrated in FIG. 3 is conducted once. In this case, a total area indicated in a bar graph in FIG. 3 indicates the power consumption of that day. In this case, the required time of the operating state is calculated based on the number of sheets of the print job. The required time of the OFF state is acquired by deducting all required times of other states from one day (24 hours). In a case of entering two or more print jobs, the power consumption in one day can be calculated in the same manner.

The platform is a concept for a set of a plurality of device types. That is, there are a plurality of device types for one platform. Accordingly, since the power consumption and the required time for each state transition and each state are known for each platform, the power consumption and the required time for each state transition and each state are used in common for the plurality of device types.

In order to calculate the power consumption of the devices 20 based on the above explanation, the power consumption calculation apparatus 10 includes the following functional configuration. FIG. 4 is a diagram illustrating a functional configuration example of the power consumption calculation apparatus according to the first embodiment of the present invention. In FIG. 4, the power consumption calculation apparatus 10 includes a device search part 11, a unit time calculation part 12, a measurement part 13, a power consumption calculation part 14, an environmental impact calculation part 15, a display control part 16 for a calculation result, a state transition data management part 121, a measured value recording part 122, a device dependent value DB (DataBase) 123, and the like.

The device search part 11 automatically searches for the devices 20 connected to the network 30. A method and a protocol for automatically searching for the devices 20 can be conducted by using a well-known technology such as a broadcast or the like. The unit time calculation part 12 determines a time interval (hereinafter, called "unit term") for periodically measuring information (the number of print sheets for each unit term in this embodiment) indicating an operation amount (a work load of a job) of the devices 20, based on data managed in the state transition data management part 121. The measurement part 13 measures the number of print sheets of the devices 20 periodically at intervals calculated by the unit time calculation part 12. The measured value recording part 122 includes a storage area to record a measured value (the number of print sheets per unit term) by the measurement part 13. For example, the storage area for the measured values is formed in the memory unit 103. The power consumption calculation part 14 calculates the power consumption of the devices 20 based on the measured value recorded in the measured value recording part 122, data maintained in the state transition data management part 121, and data recorded in the device dependent value DB 123. The environmental impact calculation part 15 calculates an environmental impact value such as $CO_2$ emission and the like based on the power consumption. The display control part 16 displays calculation results acquired by the power consumption calculation part 14 and the environmental impact calculation part 15.

The state transition data management part 121 includes a storage area to manage data (hereinafter, called "power consumption state transition data") indicating the power consumption and the required time for each state in the state transition of the devices 20, for each device type. As described above, the power consumption state transition data may be in common among the plurality of device types (but is different for each platform). In this embodiment, for the sake of convenience, the power consumption state transition data are different for each of the device types. The device dependent value DB 123 is a database to which values of parameters different for each device type (each model) of the devices 20 are registered. For example, the device dependent value DB 123 is formed in the auxiliary storage unit 102. For example, the dependent values include parameter values (a print speed in this embodiment) indicating an identification name of a manufacturer, and a performance.

In the following, steps in a process conducted by the power consumption calculation apparatus 20 will be described. FIG. 5 is a flowchart for explaining the steps in the process conducted by the power consumption calculation apparatus 10.

In step S101, the device search part 11 automatically searches for the devices 20 (in an environment of calculating the power consumption) connected to the network 30. By conducting the step S101, identification information of each of the devices 20 connected to the network 30 is acquired. Alternatively, the identification information of each of the devices 20 connected to the network 30 may be input by a user using the input unit 107. The identification information may be information possible to search for the device dependent value and the power consumption state transition data of each of the devices 20. Thus, the identification information may not always be unique information for each of the devices 20. That is, for example, the identification information may be the device type name (a model name).

Subsequently, the following steps S102 through S111 are conducted in parallel for each of the devices 20 being searched or indicated in the step S101.

First, the unit time calculation part 12 acquires the power consumption state transition data corresponding to the identification information of the device 20 from the state transition data management part 121, and stores the power consumption state transition data in the memory unit 103 (step S102).

FIG. 6 is a diagram illustrating a detailed example of the power consumption state transition data. Power consumption state transition data 150 illustrated in FIG. 6 are described in an XML (eXtensible Markup Language) format. However, the power consumption state transition data 150 is not limited to a specific data format. Contents of the power consumption state transition data 150 correspond to a state transition illustrated in FIG. 3.

In the power consumption state transition data 150, a device profile element enclosed by a <device profile> tag is a root element. A value "AAA" of a model attribute 151 of the device profile element indicates that the power consumption state transition data 150 correspond to the device 20 of which the device type is "AAA".

A states element being a child element of the device profile element is an element corresponding to the state transition of the device 20. The states element includes a state element as a child element of the states element for each of states included in the state transition. In FIG. 6, five state elements (state elements 152, 153, 154, 155, and 156) are included as the child elements of the states element. Accordingly, transitions of five states are made.

Each state element includes a name attribute, and further includes a time element and a power element as child elements. A value of the name attribute indicates a state name. A value of the time element indicates the required time (seconds) of the state. A value of the power element indicates the power consumption (W). A value of the time attribute of the state element 153 corresponding to the operating state indicates {RelationPrintTime}. This value indicates that the required time of the operating state depends on a printing time (the number of print sheets). The state element 156 corresponding to the OFF state does not include the time element, since the required time of the OFF state varies depending on the required time of other states (a count of the state transitions and the number of print sheets).

Subsequently, the unit time calculation part 12 calculates the unit time based on the power consumption state transition data 150 (step S103). In detail, an essential required time to execute one job is defined as the unit time. The essential required time to execute one job is a total required time for all states (the pre-process state, the operating state, the waiting state, and the sleep state) transited in response to an execution of one job. The required time of the operating state varies, and is not defined as a constant time. Thus, the required time (that is, zero) in printing zero sheets is input as the essential required time. Accordingly, the unit time is calculated based on the power consumption state transition data 150 as follows:

$$\begin{aligned}\text{unit time} &= \text{required time (43) of pre-process state} + \\ &\quad \text{required time (0) of operating state} + \\ &\quad \text{required time (300) of waiting state} + \\ &\quad \text{required time (900) of sleep state} \\ &= 1243 \text{ seconds}\end{aligned}$$

The meaning of the above-described calculation method of the unit time will be described later.

Subsequently, the measurement part 13 acquires a value of a print counter from each of the devices 20 periodically at the intervals of the unit time, and records the value of the print counter in the memory unit 103 (step S104). The print counter is a counter used to record a total number of print sheets since each of the devices 20 has been installed. After starting to acquire the value of the print counter, when a measurement term (for example, one day=24 hours) indicated beforehand lapses (No in the step S105), the measurement part 13 calculates the number of print sheets for each unit time, and records a calculation result in the measured value recording part 122 (step S106). The number of print sheets for each unit time is calculated based on a difference between values (the total numbers of the print sheets) of the print counter before and after the unit time. As a result, data (hereinafter, called "measured value data") illustrated in FIG. 7 are recorded in the measured value recording part 122.

FIG. 7 is a diagram illustrating an example of the measured value data. In FIG. 7, the horizontal axis indicates an acquisition count (a count of the unit time) of the print counter, and the vertical axis indicates the number of print sheets for each unit time. That is, the measured value data indicate the number of print sheets for each unit time.

Subsequently, the power consumption calculation part 14 determines a presence or an absence of the state transition for each unit time based on the measured valued data recorded by the measured value recording part 122 and data registered by the device dependent value DB 123, and calculates the required time of the operating state regarding the unit time during which the state transition is made (step S107). The presence or the absence of the state transition during each unit time is determined based on a presence or an absence of the number of print sheets. That is, during the unit time in which the number of print sheets indicates zero, no print job is executed. Thus, it is determined that the state transition is not made. On the other hand, during the unit time in which the number of print sheets indicates one or more, the print job is executed. Accordingly, it is determined that the state transition is made.

Also, the required time of the operating state is calculated based on the following expression:

required time (seconds) of operating state=(number of print sheets÷IPM)×60

An IPM (Image Per Minute) is an index indicating a print speed of the device 20, and indicates the number of print sheets per minute. A value of the IPM is registered in the device dependent value DB 123 for each device type.

Subsequently, the power consumption calculation part 14 calculates the power consumption for each unit time, by applying the required time of the operating state which is calculated and the values included in the power consumption state transition data 150, for each unit time in which the state transition is present (is made) (step S108).

power consumption for each unit time=(power consumption in pre-process state÷3600×required time of pre-process state)+(power consumption in operating state÷3600×required time of operating state)+(power consumption in waiting state÷3600×required time of waiting state)+ (power consumption in sleep state÷3600×required time of sleep state)

Subsequently, the power consumption calculation part 14 calculates the power consumption of the measurement term (for example, one day) (step S109). The power consumption during the measurement term is calculated by aggregating a summation of power consumption in each unit time and the power consumption during the OFF state in the measurement term. The power consumption of the OFF state is calculated by applying the values included in the power consumption state transition data 150 to the following expression:

power consumption during the OFF state=power consumption of OFF state/3600×required time of OFF state The required time of the OFF state is calculated by deducting the required time of the pre-process state, the required time of the operating state, the required time of the waiting state, and the required time of the sleep state concerning all state transitions during the measurement term, from the measurement term.

Subsequently, the environmental impact calculation part 15 calculates expense (electricity charges), carbon dioxide emission, an environmental impact such as a forest area or the like required to absorb the carbon dioxide, and the like, based on the calculated power consumption in the measurement term (step S110). These environmental impacts and the like may be calculated by applying a known function concerning the power consumption.

Subsequently, the display control part 16 displays the calculation results acquired by the power consumption calculation part 14 and the environmental impact calculation part 15 (step S111).

Figure 8:
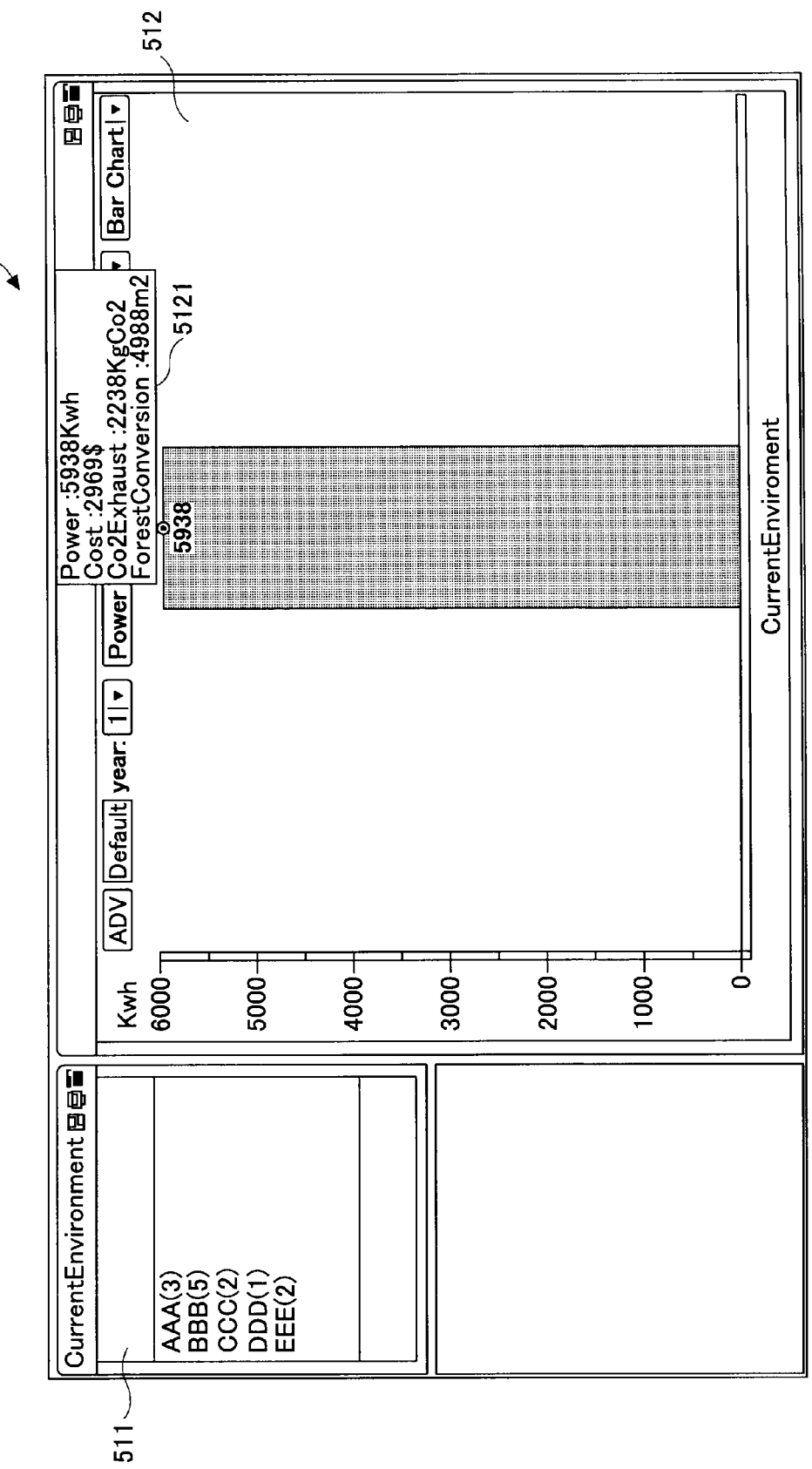
FIG. 8 is a diagram illustrating a display example of calculation results.

FIG. 8 is a diagram illustrating a display example of the calculation result. In FIG. 8, a display screen 510 for the calculation results includes a display area 511 for a current device configuration and a display area 512 for the power consumption.

The display area 511 is an area to display details for each of the manufacturers of the devices 20 in an environment (calculation environment) for which the power consumption is calculated, with respect to the devices 20 connected to the network 30. "AAA", "BBB", and the like indicate manufacturer names, and numerals inside parentheses indicate the number of devices 20.

In the display area 512 for the power consumption, the power consumption for one year is indicated by a bar graph. Also, in a rectangle 5121, the power consumption, the expense (electric charge), the carbon dioxide emission, the forest area required to absorb the carbon dioxide emission, and the like are displayed. The power consumption for one year may be calculated based on the power consumption during the measurement term. For example, if the measurement term is one day, the power consumption in the measurement term is multiplied by 365.

The power consumption calculation apparatus 10 not only calculates the power consumption based on the device configuration in an actual environment, but also can simulate how the power consumption changes.

Figure 9:
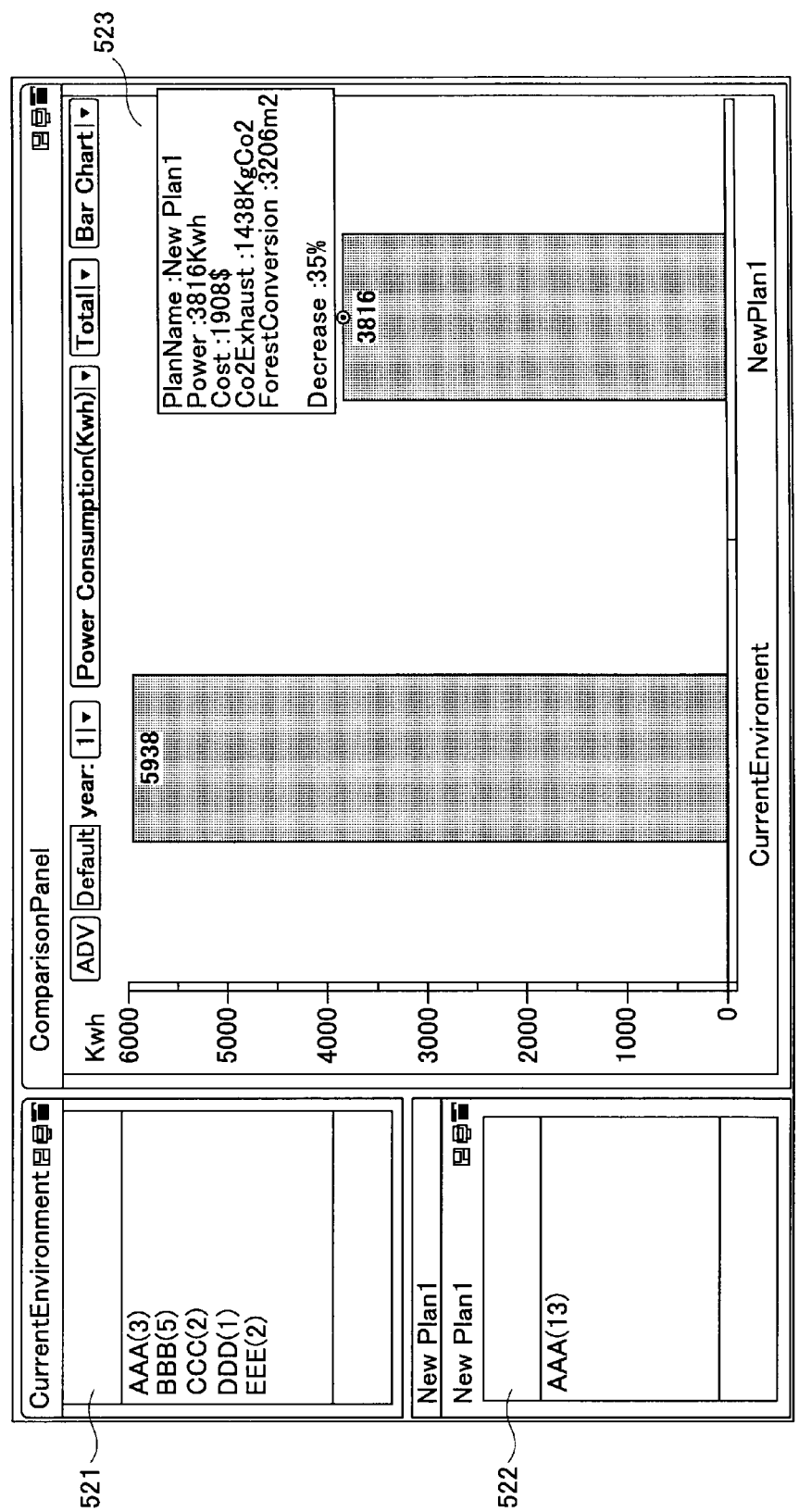
FIG. 9 is a diagram illustrating a display example of a simulation result in a case of changing a device configuration in a measurement circumstance.

For example, FIG. 9 is a diagram illustrating a display example of a simulation result in a case of changing the device configuration in the measurement environment. In FIG. 9, the simulation result screen 520 includes a display area 521 for a current device configuration, a display area 522 for a changed device configuration, a display area 523 for the power consumption, and the like.

The display area 521 for the current device configuration is the same as the display area 511 for the current device configuration of the display screen 510 for the calculation results (FIG. 8). The display area 522 for the changed device configuration is an area to display the device configuration after the device configuration is changed. In the display example in FIG. 9, all devices are replaced with devices of one specific manufacturer "AAA".

The display area 523 for the power consumption shows the power consumption of the current device configuration, the power consumption of the changed device configuration, and the like are shown by the bar graph. A left bar indicates the power consumption in the current device configuration, and a right bar indicates the power consumption in the changed device configuration. In this case, the power consumption is significantly reduced after the device configuration is changed. Accordingly, for example, a sales person or the like of the manufacturer displays the simulation result screen 520 and offers a replacement of the devices 20 in the current device configuration. Also, a system administrator or the like in an office refers to the simulation result screen 520 and considers replacing the devices 20 in the current device configuration.

In order to display the simulation result screen 520, a user may input a device type to replace a current device type for each of current devices 20, into the power consumption calculation apparatus 10. Then, the power consumption calculation part 14 calculates the power consumption for the changed device configuration based on the number of print sheets for each unit time for each of the current devices 20 recorded in the measured value recording part 122, and the power consumption state transition data 150 and a device dependent value of devices 20 in the changed device configuration.

As described, in the power consumption calculation apparatus 10 according to the first embodiment, instead of installing a power meter for each of the devices 20, it is possible to properly calculate the power consumption, the environmental impact, and the like for each of the devices 20 at the office or the like.

In the first embodiment, the print job is explained as an example. In addition, the present invention can be applied to various jobs concerning a copy, a scan, a facsimile transmission, and the like, and also to the devices 20 in which various jobs are mixed. That is, the state transition data 15 may be prepared for each type of the job, and the unit time may be calculated for each type of the job. Then, the work load (the number of copy sheets, the number of scan sheets, the number of sheets being sent and the number of facsimile sheets being received by facsimile, and the like) of the job may be acquired for each type of the job. The other steps are conducted in the same manner as described above for the print job.

Also, in this embodiment, a state transition model which transits to file states is explained as an example. However, the state transition model can be different depending on the device type or the platform. Accordingly, the power consumption state transition data 150 may be defined for each of the state transition models. By defining the power consumption state transition data 150, versatility of the power consumption calculation apparatus 10 can be guaranteed for device types of the devices 20, types of the platforms, and the like.

A calculation method of the unit time in the first embodiment will be described. In the first embodiment, the number of the state transitions significantly influences the calculation result. Thus, it is required to precisely comprehend the number of the state transitions. Also, in the first embodiment, the presence or the absence of the state transition is determined based on whether or not a print is conducted. That is, when the print job is performed within the unit time, it is determined that the state transition is made once within the unit time.

In this determination method, it is assumed that the unit time is defined as a considerably longer time with respect to a minimum time of the state transition (hereinafter, called "case 1"). In a certain unit time, a print job of 50 sheets is performed twice. In this case, in the process in accordance with the flowchart in FIG. 5, this print job is processed as one performance of a print job of 100 sheets in the unit time, and then, it is determined that one state transition is made. As a result, calculated power consumption may be smaller than actual power consumption.

On the other hand, it is assumed that the unit time is defined as a considerably shorter time with respect to the minimum time of the state transition (hereinafter, called "case 2"). Moreover, it is assumed that one print job requires two unit times to be performed. In this case, in the process in accordance with the flowchart in FIG. 5, it is determined that two state transitions are made, even if only one state transition is actually made. As a result, the calculation power consumption may be greater than the actual power consumption.

In order to overcome the above-described problems, in the first embodiment, the minimum time of the state transition is defined as the unit time. However, a period of the unit time does not synchronize with a timing of the actual state transition. For example, one print job requiring two unit times may be performed. In comparing the case 1 and the case 2, a difference between the calculated power consumption and an actual measured value can be significantly reduced. Accordingly, the calculation method of the unit time in the first embodiment can be considered as a proper method in which the difference can be reduced.

In the first embodiment, the required time of the operating state is defined as zero, and the unit time is calculated. For example, the required time of the operating state may be calculated based on an experience value of an average of the number of print sheets for one print job, and the unit time may be calculated by using this calculated required time.

Figure 10:
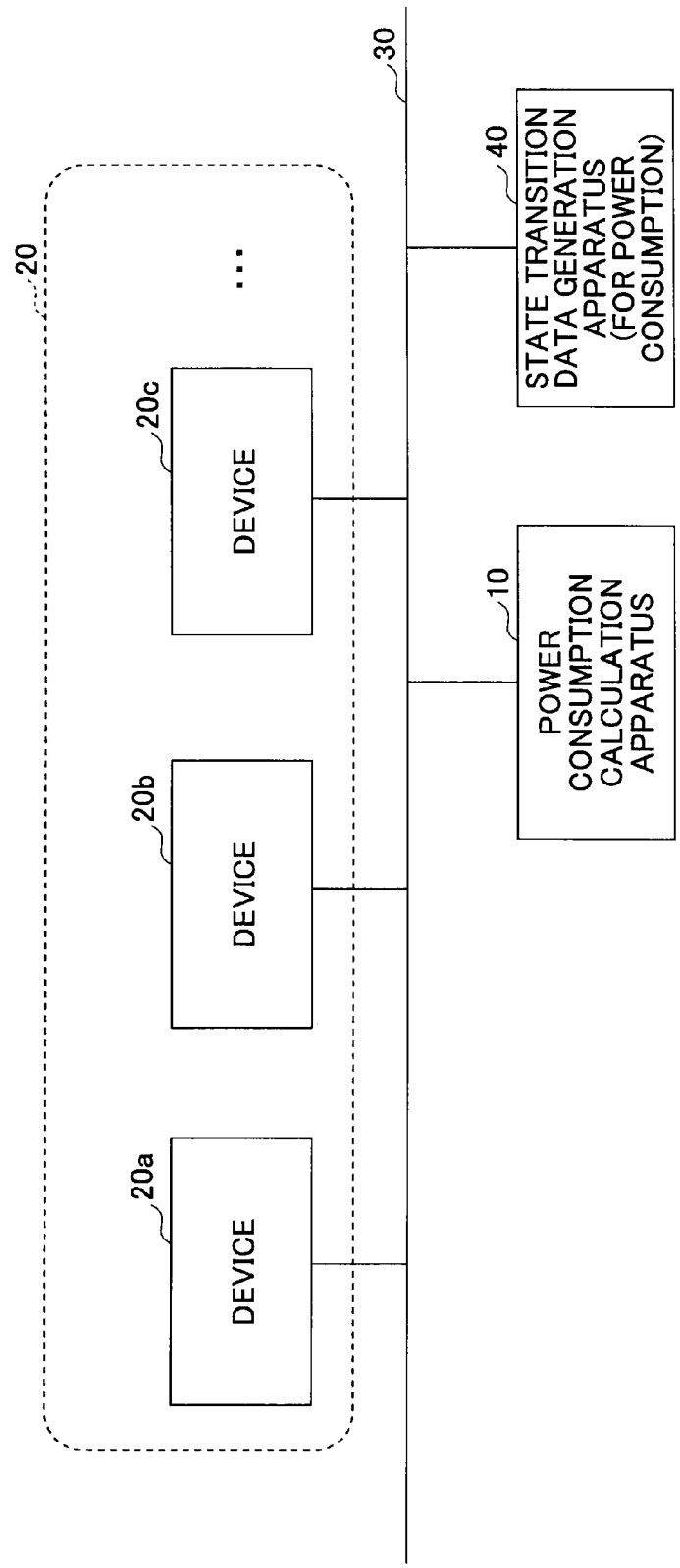
FIG. 10 is a diagram illustrating a configuration example of a power consumption calculation system according to a second embodiment of the present invention.

Next, a second embodiment will be described. FIG. 10 is a diagram illustrating a configuration example of a power consumption calculation system according to the second embodiment. In FIG. 10, parts that are the same as the ones in FIG. 1 in the first embodiment are indicated by the same reference numerals, and explanation thereof will be omitted.

In FIG. 10, a state transition data generation apparatus 40 for power consumption is additionally connected to the network 30. The state transition data generation apparatus 40 is a computer to automatically generate the power consumption state transition data 150 for a device 20 of which the power consumption state transition data 150 cannot be acquired (which does not open necessary information for the power consumption state transition data 150). A hardware configuration of the state transition data generation apparatus 40 may be the same as the hardware configuration illustrated in FIG. 2.

Figure 11:
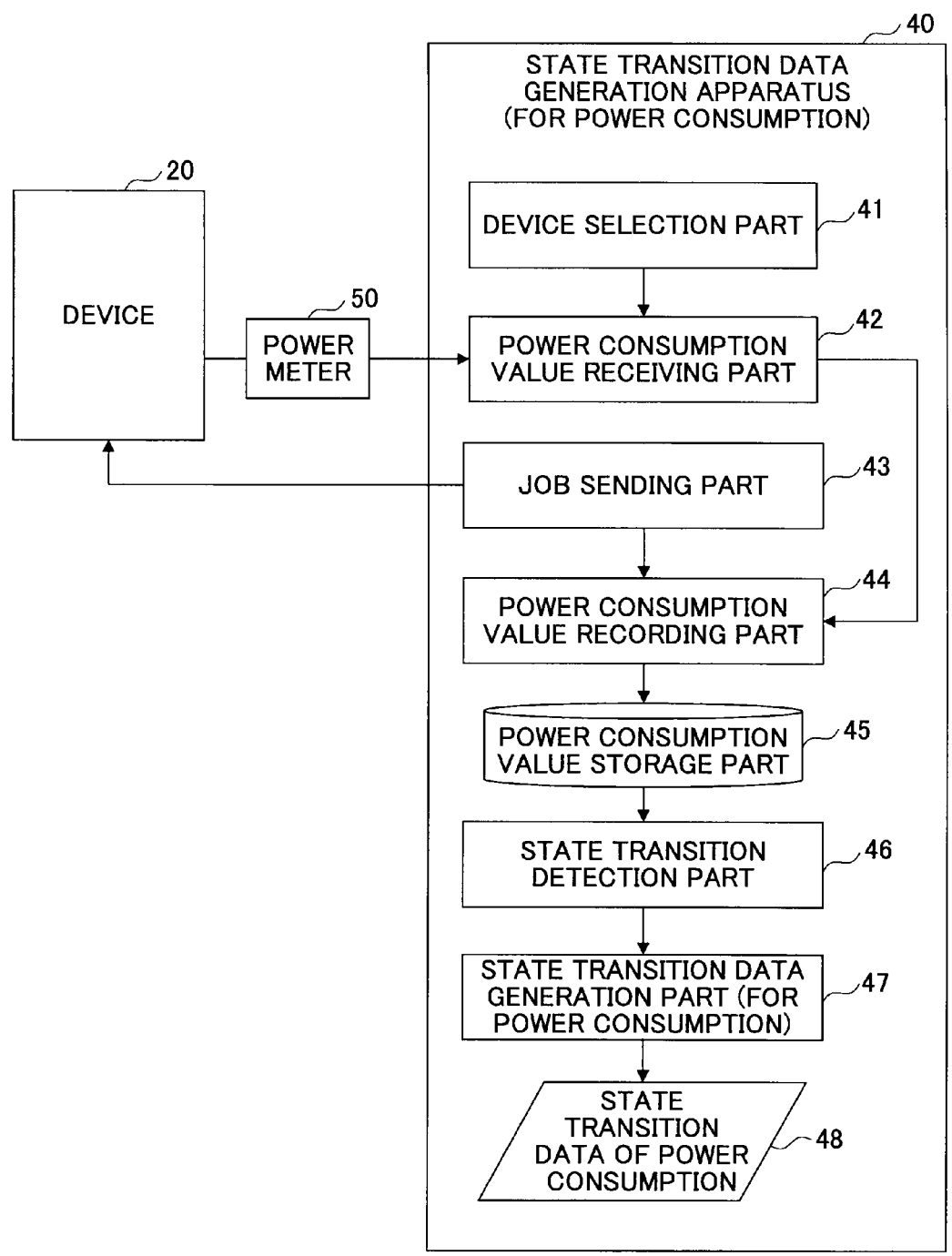
FIG. 11 is a diagram illustrating a functional configuration example of a state transition data generation apparatus for power consumption.

FIG. 11 is a diagram illustrating a functional configuration example of the state transition data generation apparatus for the power consumption. In FIG. 11, the state transition data generation apparatus 40 includes a device selection part 41, a power consumption value receiving part 42, a job sending part 43, a power consumption value recording part 44, a power consumption value storage part 45, a state transition detection part 46, a state transition data generation part 47 for the power consumption, and the like.

The power consumption value receiving part 42 sequentially (periodically) receives a power consumption value of the device 20 from a power meter 50 connected to the device 20 (between the device 20 and a socket). The power meter 50 is a meter for measuring the power consumption, and is generally available on the market. The power consumption value is received from the power meter 50 through a wired or wireless communication. Alternatively, if the power consumption can be measured, an ampere meter can be used as the power meter 50.

The job sending part 43 enters (sends) a job to the device 20. In the second embodiment, an example of entering a print job will be described. However, a type of a job is not limited to a specific type.

The power consumption value recording part 44 records the power consumption value received by the power consumption receiving part 42 and information indicating a relation to time when the power consumption value is received, to the power consumption value storage part 45. The power consumption value recording part 45 is a storage area in a memory unit, an auxiliary storage unit, or the like of the state transition data generation apparatus 40 for the power consumption.

The state transition detection part 46 detects the state transition (a segmentation of the state) of the device 20 based on the information recorded in the power consumption value storage part 45. The state transition data generation part 47 generates power consumption state transition data 48 based on the detected state transition. The power consumption state transition data 48 are data having the same structure as the power consumption state transition data 150 according to the first embodiment. That is, data including the power consumption and the required time are recorded for each state of the device 20.

In the following, steps in a process of the state transition data generation apparatus 40 for the power consumption will be described. FIG. 12 is a flowchart for explaining the steps in the process conducted by the state transition data generation apparatus 40.

In response to an indication input by a user, the device selection part 41 automatically searches for the devices 20, and displays a list screen for listing the devices 20 (step S201). Subsequently, the device selection part 41 receives a selection indicating one of the devices 20 to set as a subject to generate the power consumption state transition data 150 from the user operating the list screen (step S202). It is preferable not to enter a job to the selected device 20 (from other than the state transition data generation apparatus 40), in order to reduce a difference or an error in detecting the state transition.

Subsequently, the power consumption value receiving part 42 begins receiving a power value (power consumption value of the selected device 20) from the power meter 50 connected to the selected device 20 (step S203). It should be noted that the power consumption value is successively received. Subsequently, the power consumption value recording part 44 records the power consumption currently received (in the steady state in which the print job has not performed) as an initial power value in the power consumption value storage part 45 (step S204).

After completing a recording of the initial power value, for example, the job sending part 43 sends an execution request (print data) of the print job for one sheet of a document (enters the print job) (step S205). In response to an entry of the print job, the power consumption value recording part 44 records the power consumption value successively received, and the time when the power consumption value is received, in the power consumption value storage part 45 (steps S206 and S207). That is, in response to the entry of the print job, the power consumption value is changed (increased or decreased). The power consumption value being changed is recorded with the time. The time is calculated by a timer provided in the state transition data generation apparatus 40. A value recorded as the time may be a present time or an elapsed time from a predetermined time (for example, a time when the print job is entered). That is, time, in which a relative relation among recorded times can be determined, may be used.

The steps S206 and S207 are repeated until it is determined that the state transition of the selected device 20 by executing the print job is completed. This determination is made based on whether or not the received power consumption value is approximately equal to the initial power value (step S208). For example, the power consumption recording part 44 determines that the state transition of the selected device 20 by executing the print job is completed when a difference between the received power consumption value and the initial power value falls within a predetermined threshold, and terminates recording the power consumption value (Yes in step S208).

Subsequently, the job sending part 43 enters the print job for a plurality of sheets of a document to the selected device 20 (step S209). In response to the entry of the print job, the power consumption value recording part 44 records the power consumption value successively received and time when the power consumption value is received, to the power consumption value storage part 45 (steps S210 and S211). The power consumption value recording part 44 identically records data (power consumption values and the like) recorded for a previous print job (step S205) and data recorded for a current print job (step S209). When the difference between the received power consumption value and the initial power value falls within the threshold, the power consumption value recording part 44 determines that the state transition of the selected device 20 by executing the print job is completed, and terminates recording the power consumption value (Yes in step S212).

As described above, the information indicating the relation between the power consumption and the time is recorded for each of two print jobs.

Subsequently, the state transition detection part 46 detects the state transition (a change of the state or a segmentation of the state) of the selected device 20 for each print job, based on the information recorded in the power consumption value storage part 45 (step S213). For example, the state transition detection part 46 detects the change exceeding a predetermined threshold of the power consumption value as the state transition of the selected device 20. Alternatively, the state transition may be detected by conducting a signal process to the information recorded in the power consumption value storage part 45. For example, as the signal process, Fourier transformation, a wavelet transformation, or the like can be used. In a case of using a discrete wavelet transformation, the state transition may be detected based on a basis function of the discrete wavelet transformation. It should be noted that each state is segmented by detecting the state transition.

Subsequently, the state transition data generation part 47 for the power consumption calculates the power consumption value and the required time for each state in the state transition detected by the state transition detection part 46 (step S214).

The required time for each state may be a time interval between one state transition and another state transition which are detected by the state transition detection part 46. For example, the power consumption value for each state may be an average value, a maximum value, a minimum value, and the like of the power consumption values recorded during a time period of each state (during the required time). The power consumption value and the required time for each state are calculated for each print job.

Subsequently, the state transition data generation part 47 for the power consumption outputs the power consumption state transition data 150 to an auxiliary storage unit based on the power consumption value and the required time for each state, which are calculated for each print job (step S215). In this case, the state transition data generation part 47 compares two required times for each state in two print jobs, and determines that a state, in which a difference between two required times exceeds a predetermined threshold, is a state in which the required time is changed depending on the number of print sheets (a state corresponding to the "operating state" in the first embodiment). The state transition data generation part 47 records {RelationPrintTime} in the power consumption state transition data 150 regarding the required time of the state (a value of a time attribute), instead of an absolute value. Regarding a state in which the difference between two required times in two print jobs falls within the predetermined threshold, the absolute value of the required time is recorded in the power consumption state transition data 150. The absolute value may be either one of two required times in two print jobs, or an average value of two required times concerning two print jobs.

Moreover, the state transition data generation part 47 for the power consumption records the initial power value as the power consumption value corresponding to the OFF state in the power consumption state transition data 150. It should be noted that it is not required to distinguish each of the states (for example, the pre-process state, the waiting state, the sleep state, and the like) other than the operating state and the OFF state. Accordingly, for example, a name for each of the states in the power consumption state transition data 150 can be a "first state", a "second state", and the like.

By the above-described process, the power consumption state transition data 150 can be generated. In the above, the example of entering two print jobs is described, but three or more print jobs can be entered in this embodiment. In this case, the required time and the power consumption value for each of states are acquired by considering values corresponding to the three print jobs or more. It can be considered that by increasing the number of print jobs to enter, approximate power consumption state transition data 150 are generated due to a characteristic of the selected device 20.

As described above, in the state transition data generation apparatus 40 according to the second embodiment of the present invention, even if the power consumption state transition data 150 are not published for the selected device 20, it is possible to automatically generate the power consumption state transition data 150. Accordingly, the first embodiment can be performed by using the power consumption state transition data 150 generated by the state transition data generation apparatus 40, and it is possible to properly calculate the power consumption, the environmental impact, and the like for each of the devices 20 installed at the office or the like.

In a circumstance in which it is difficult to use the state transition data generation apparatus 40 for the power consumption since it is difficult to install the power meter, the power consumption state transition data 150 may be created by the user and the first embodiment may be performed.

Alternatively, regarding a combination of a production year and a performance (print speed) of each of the devices 20, typical power consumption state transition data 150 may be prepared in a database in the auxiliary storage unit 102 of the power consumption calculation apparatus 10, and the database may be used. In this case, the user may input the production year and the performance for each of the devices 20. The state transition calculation apparatus 10 searches for the power consumption state transition data 150 from the database based on the production year and the performance input by the user, and calculates the power consumption of each of the devices 20 by using the power consumption state transition data 150.

In the second embodiment, the image forming apparatuses are illustrated as preferred devices 20. However, the devices 20 are not limited to the image forming apparatuses and the present invention can be applied to any devices from which information (work load and the like) can be acquired. For example, regarding a fluorescent lamp, an air conditioning facility, a computer, an electric appliance, and any other devices influencing the power consumption and the carbon dioxide emission when being used, states of a device depending on its characteristic may be considered, and the power consumption may be calculated (estimated) based on information indicating the states. Moreover, a combination of these devices and the image forming apparatus can be a calculation subject of the power consumption, and the present invention can be applied so as to totally support an office environment.

According to the present invention, it is possible to properly calculate the power consumption of each of the devices such as the image forming apparatuses or the like.

The present invention is not limited to the specifically disclosed embodiments, and variations and modifications may be made without departing from the scope of the invention.

The present application is based on the Japanese Priority Patent Applications No. 2008-238619 filed on Sep. 17, 2008, and No. 2008-238620 filed on Sep. 17, 2008 the entire contents of which are hereby incorporated by reference.

What is claimed is:

1. A power consumption calculation apparatus, comprising:
a work load measurement part configured to measure a work load of a job executed by an image forming apparatus and to record a measured value, at predetermined times;
a management part configured to manage state transition data indicating, for a type of the image forming apparatus, power consumption and a required time for each of states of the image forming apparatus which transitions in response to an execution of each job;
an acquiring part configured to acquire identification information of the image forming apparatus from the image forming apparatus connected through a network;
a time calculation part configured to acquire, from the management part, the state transition data corresponding to the identification information, generating of the state transition data including comparing a first required time and a second required time for each state in at least two jobs, determining a type of state in response to whether a difference between the first required time and the second required time exceeds a predetermined value, a state being of a type of which the required time varies depending on a number of sheets to print, when the difference between the first required time and the second required time exceeds the predetermined value, and the generating of the state transition data including recording information indicating the required time of the state, which is of the type of which the required time varies, into the state transition data at the state transition detected for each of the at least two jobs,
configured to calculate an aggregation of the required times of the states based on the state transition data, and
configured to calculate the predetermined time based on the aggregation of the required times of the states; and
a power consumption calculation part configured to calculate a power consumption amount corresponding to one job execution at each predetermined time when it is determined that the job corresponding to the work load is executed, based on the measured value and the state transition data.

2. The power consumption calculation apparatus as claimed in claim 1, wherein the power consumption calculation part is configured to calculate a required time of a state which changes depending on the work load of the executed job, based on the measured value, and to calculate the power consumption amount by applying the calculated required time to the state transition data.

3. The power consumption calculation apparatus as claimed in claim 1, wherein the time calculation part is configured to calculate the predetermined time so that the required time of the state which changes depending on the work load of the executed job is determined as zero, or so as to be a time corresponding to the work load of a predetermined job.

4. The power consumption calculation apparatus as claimed in claim 1, wherein the executed job corresponding to the work load is a print job, and the measured value is a number of print sheets.

5. The power consumption calculation apparatus as claimed in claim 1, wherein the states of the image forming apparatus include a pre-process state, an operating state, a waiting state, and a sleep state.

6. A power consumption calculation method performed by a computer including a processor, said power consumption calculation method comprising:
measuring a work load of a job executed by an image forming apparatus and recording a measured value, at predetermined times;
acquiring identification information of the image forming apparatus from the image forming apparatus connected through a network;
acquiring, from a management part that manages state transition data indicating, for a type of the image forming apparatus, power consumption and a required time for each of states of the image forming apparatus which transits transitions in response to an execution of each job, the state transition data corresponding to the identification information of the image forming apparatus generating of the state transition data including comparing a first required time and a second required time for each state in at least two jobs, determining a type of state in response to whether a difference between the first required time and the second required time exceeds a predetermined value, a state being of a type of which the required time varies depending on a number of sheets to print, when the difference between the first required time and the second required time exceeds the predetermined value, and the generating of the state transition data including recording information indicating the required time of the state, which is of the type of which the required time varies, into the state transition data at the state transition detected for each of the at least two jobs;

calculating a power consumption amount corresponding to one job execution at each predetermined time when it is determined that the job is executed, based on the measured value and the state transition data; and calculating an aggregation of the required times of the states based on the state transition data and calculating the predetermined time based on the aggregation of the required times of the states.

7. The power consumption calculation method as claimed in claim 6, wherein the calculation of the power consumption amount includes calculating a required time of a state which changes depending on the work load of the executed job, based on the measured value, and calculating the power consumption amount by applying a calculated required time to the state transition data.

8. The power consumption method as claimed in claim 6, wherein the calculation of the aggregation of the required times includes calculating the predetermined time so that the required time of the state which changes depending on the work load of the executed job is determined as zero, or so as to be a time corresponding to the work load of a predetermined job.

9. The power consumption method as claimed in claim 6, wherein the executed job corresponding to the work load is a print job, and the measured value is a number of print sheets.

10. A state transition data generation method performed by a computer including a processor, said state transition data generation method comprising:

receiving a power consumption value periodically from a meter connected to an image forming apparatus, the meter capable of measuring the power consumption value;

sending an execution indication of each of a first job and a second job to the image forming apparatus;

recording information indicating a relation between the power consumption value received in response to sending the execution indication of each of the first job and the second job, and a time when the power consumption value is received, to a recording part;

detecting a state transition for each of the first job and the second job of the image forming apparatus in response to an execution of each of the first job and the second job, based on the information recorded in the recording part; and generating state transition data indicating power consumption and a required time for each of states of each of the first job and the second job, the generating of the state transition data including comparing a first required time and a second required time for each state in the first job and the second job, determining a type of state in response to whether a difference between the first required time and the second required time exceeds a predetermined value, a state being of a type of which the required time varies depending on a number of sheets to print, when the difference between the first required time and the second required time exceeds the predetermined value, and the generating of the state transition data including recording information indicating the required time of the state, which is of the type of which the required time varies, into the state transition data at the state transition detected for each of the first job and the second job.

11. The state transition data generation method as claimed in claim 10, wherein the first job and the second job have different work loads.

12. The state transition data generation method claimed in claim 10, wherein the detection of the state transition determines that the state is transited, when the power consumption changes and exceeds a predetermined threshold.

13. The state transition data generation method as claimed in claim 10, wherein the detection of the state transition detects the state transition by conducting a predetermined signal process with respect to the information recorded in the recording part.

* * * * *